(12) United States Patent
Jeddeloh

(10) Patent No.: US 7,979,757 B2
(45) Date of Patent: Jul. 12, 2011

(54) METHOD AND APPARATUS FOR TESTING HIGH CAPACITY/HIGH BANDWIDTH MEMORY DEVICES

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 279 days.

(21) Appl. No.: 12/132,332

(22) Filed: Jun. 3, 2008

(65) Prior Publication Data
US 2009/0300444 A1    Dec. 3, 2009

(51) Int. Cl.
G11C 29/00    (2006.01)
(52) U.S. Cl. .......................................... 714/718; 714/719
(58) Field of Classification Search .................. None
See application file for complete search history.

(56) References Cited

U.S. PATENT DOCUMENTS

| | | | |
|---|---|---|---|
| 5,960,008 A * | 9/1999 | Osawa et al. .................. 714/726 |
| 6,052,329 A | 4/2000 | Nishino et al. ................. 365/233 |
| 6,122,688 A | 9/2000 | Barth et al. .................... 710/100 |
| 6,363,017 B2 | 3/2002 | Polney ...................... 365/189.02 |
| 6,401,213 B1 | 6/2002 | Jeddeloh ........................ 713/401 |
| 6,519,194 B2 * | 2/2003 | Tsujino et al. ................. 365/201 |
| 6,574,626 B1 * | 6/2003 | Regelman et al. ..................... 1/1 |
| 6,882,304 B2 | 4/2005 | Winter et al. .................. 342/128 |
| 6,907,555 B1 * | 6/2005 | Nomura et al. ................ 714/719 |
| 7,058,865 B2 * | 6/2006 | Mori et al. ..................... 714/724 |
| 7,149,134 B2 | 12/2006 | Streif et al. .................... 365/194 |
| 7,168,005 B2 * | 1/2007 | Adams et al. ..................... 714/31 |
| 7,184,916 B2 * | 2/2007 | Resnick et al. ................ 702/118 |
| 7,389,375 B2 | 6/2008 | Gower et al. .................. 710/310 |
| 7,567,476 B2 * | 7/2009 | Ishikawa ........................ 365/219 |
| 7,710,144 B2 | 5/2010 | Dreps et al. ..................... 326/30 |
| 2002/0004893 A1 | 1/2002 | Chang ........................... 711/170 |
| 2002/0097613 A1 | 7/2002 | Raynham ....................... 365/200 |
| 2002/0130687 A1 | 9/2002 | Duesman ....................... 326/101 |
| 2002/0138688 A1 | 9/2002 | Hsu et al. ...................... 711/105 |
| 2004/0073767 A1 | 4/2004 | Johnson et al. ................ 711/202 |
| 2004/0246026 A1 | 12/2004 | Wang et al. ...................... 326/86 |
| 2005/0091471 A1 | 4/2005 | Conner et al. ................. 711/220 |
| 2005/0157560 A1 | 7/2005 | Hosono et al. ............ 365/185.22 |
| 2006/0126369 A1 * | 6/2006 | Raghuram ........................ 365/51 |
| 2006/0245291 A1 | 11/2006 | Sakaitani ................. 365/230.03 |
| 2006/0273455 A1 | 12/2006 | Williams et al. ............... 257/723 |
| 2007/0271424 A1 | 11/2007 | Lee et al. ....................... 711/156 |
| 2008/0147897 A1 | 6/2008 | Talbot .............................. 710/8 |
| 2009/0006775 A1 | 1/2009 | Bartley et al. ................. 711/154 |
| 2009/0016130 A1 * | 1/2009 | Menke et al. .................. 365/201 |
| 2009/0196093 A1 | 8/2009 | Happ et al. ..................... 365/163 |
| 2009/0300314 A1 | 12/2009 | LaBerge et al. ............... 711/167 |
| 2010/0005217 A1 | 1/2010 | Jeddeloh ........................... 711/1 |
| 2010/0005376 A1 | 1/2010 | LaBerge et al. ............... 714/819 |
| 2010/0014364 A1 | 1/2010 | LaBerge et al. ............... 365/193 |
| 2010/0042889 A1 | 2/2010 | Hargan ......................... 714/752 |

* cited by examiner

Primary Examiner — John J Tabone, Jr.
Assistant Examiner — Steve Nguyen
(74) Attorney, Agent, or Firm — Dorsey & Whitney LLP

(57) ABSTRACT

A plurality of stacked memory device die and a logic circuit are connected to each other through a plurality of conductors. The stacked memory device die are arranged in a plurality of vaults. The logic circuit die serves as a memory interface device to a memory access device, such as a processor. The logic circuit die includes a plurality of link interfaces and downstream targets for transmitting received data to the vaults. The logic circuit die includes a packet builder and broadcaster configured to receive command, address and data signals over separate interfaces from a conventional tester, format the signals into a packet and broadcast the signals to a plurality of vaults.

18 Claims, 4 Drawing Sheets

METHOD AND APPARATUS FOR TESTING HIGH CAPACITY/HIGH BANDWIDTH MEMORY DEVICES

TECHNICAL FIELD

This invention relates to memory devices, and, more particularly, to testing memory devices.

BACKGROUND OF THE INVENTION

As memory devices of all types have evolved, continuous strides have been made in improving their performance in a variety of respects. For example, the storage capacity of memory devices has continued to increase at geometric proportions. This increased capacity, coupled with the geometrically higher operating speeds of electronic systems containing memory devices, has made high memory device bandwidth ever more critical. One application in which memory devices, such as dynamic random access memory ("DRAM") devices, require a higher bandwidth is their use as system memory in computer systems. As the operating speed of processors has increased, processors are able to read and write data at correspondingly higher speeds. Yet conventional DRAM devices often do not have the bandwidth to read and write data at these higher speeds, thereby slowing the performance of conventional computer systems. This problem is exacerbated by the trend toward multi-core processors and multiple processor computer system. It is currently estimated that computer systems operating as high-end servers are idle as many as 3 out of every 4 clock cycles because of the limited data bandwidth of system memory devices. In fact, the limited bandwidth of DRAM devices operating as system memory can reduce the performance of computer systems to as low as 10% of the performance of which they would otherwise be capable.

Various attempts have been made to increase the data bandwidth of memory devices. For example, wider internal data buses have been used to transfer data to and from arrays with a higher bandwidth. However, doing so usually requires that write data be serialized and read data deserialized at the memory device interface. Another approach has been to simply scale up the size of memory devices or conversely shrink their feature sizes, but, for a variety of reasons, scaling has been incapable of keeping up with the geometric increase in the demand for higher data bandwidths. Proposals have also been made to stack several integrated circuit memory devices in the same package, but doing so threatens to create a large number of other problems that must be overcome.

Memory devices are typically tested to ensure the devices are in working order, as some memory cells may be defective. Complex testing systems are utilized to test the devices, including generating test signals and reading test data from the memory cells. The testing systems are expensive and require significant investment to acquire and set up. Changing or acquiring new test systems would therefore require a prohibitive amount of time and investment. As memory device design changes to increase the data bandwidth of the devices, however, the memory devices themselves may become incompatible with conventional test equipment.

Therefore, a need exists for a method and apparatus to test new memory designs utilizing conventional test equipment.

DETAILED DESCRIPTION

Figure 1:
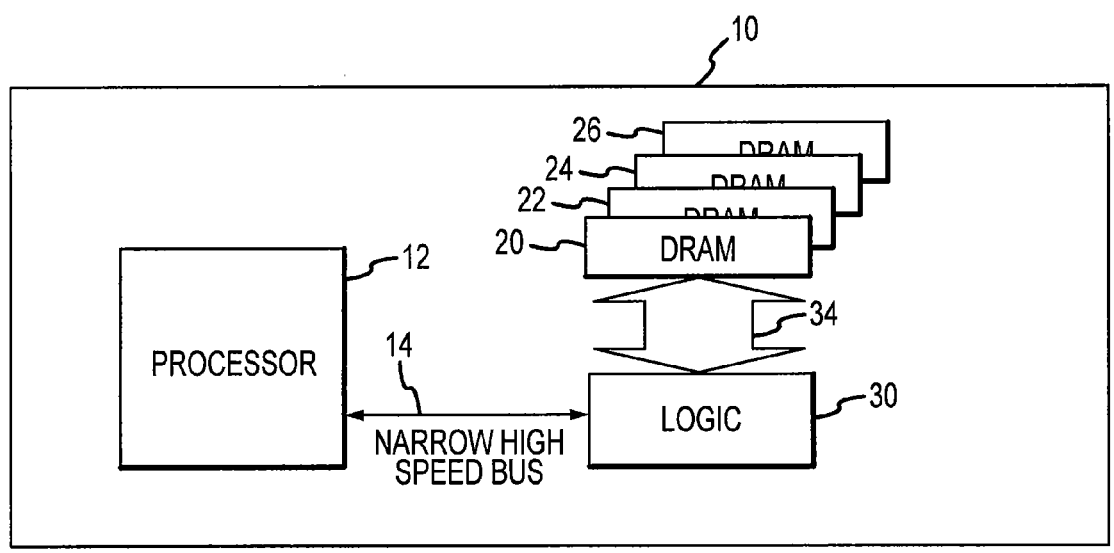
FIG. 1 is a block diagram of a computer system that includes a memory device according to an embodiment of the invention.

A computer system including a high-capacity, high bandwidth memory device 10 that can be tested according to an embodiment of the invention is shown in FIG. 1 connected to a processor 12 through a relatively narrow high-speed bus 14 that is divided into downstream lanes and separate upstream lanes (not shown in FIG. 1). The memory device 10 includes 4 DRAM die 20, 22, 24, 26, which may be identical to each other, stacked on top of each other. Although the memory device 10 includes 4 DRAM die 20, 22, 24, 26, other embodiments of the memory device use a greater or lesser number of DRAM die. The DRAM die 20, 22, 24, 26 are stacked on top of a logic die 30, which serves as the interface with the processor 12. The logic die 30 can implement a variety of functions in the memory device 10 to limit the number of functions that must be implemented in the DRAM die 20, 22, 24, 26. For example, the logic die 30 may perform memory management functions, such power management and refresh of memory cells in the DRAM die 20, 22, 24, 26. In some embodiments, the logic die 30 may perform error checking and correcting ("ECC") functions.

The DRAM die 20, 22, 24, 26 are connected to each other and to the logic die 30 by a relatively wide bus 34. The bus 34 may be implemented with through silicon vias ("TSVs"), which comprise a large number of conductors extending through the DRAM die 20, 22, 24, 26 at the same locations on the DRAM die and connect to respective conductors formed on the die 20, 22, 24, 26. In one embodiment, each of the DRAM die 20, 22, 24, 26 are divided into 16 autonomous partitions, each of which may contain 2 or 4 independent memory banks. In such case, the partitions of each die 20, 22, 24, 26 that are stacked on top each other may be independently accessed for read and write operations. Each set of 16 stacked partitions may be referred to as a "vault." Thus, the memory device 10 may contain 16 vaults. The vault may include a vertical stack of interconnected portions of the memory dies.

Figure 2:
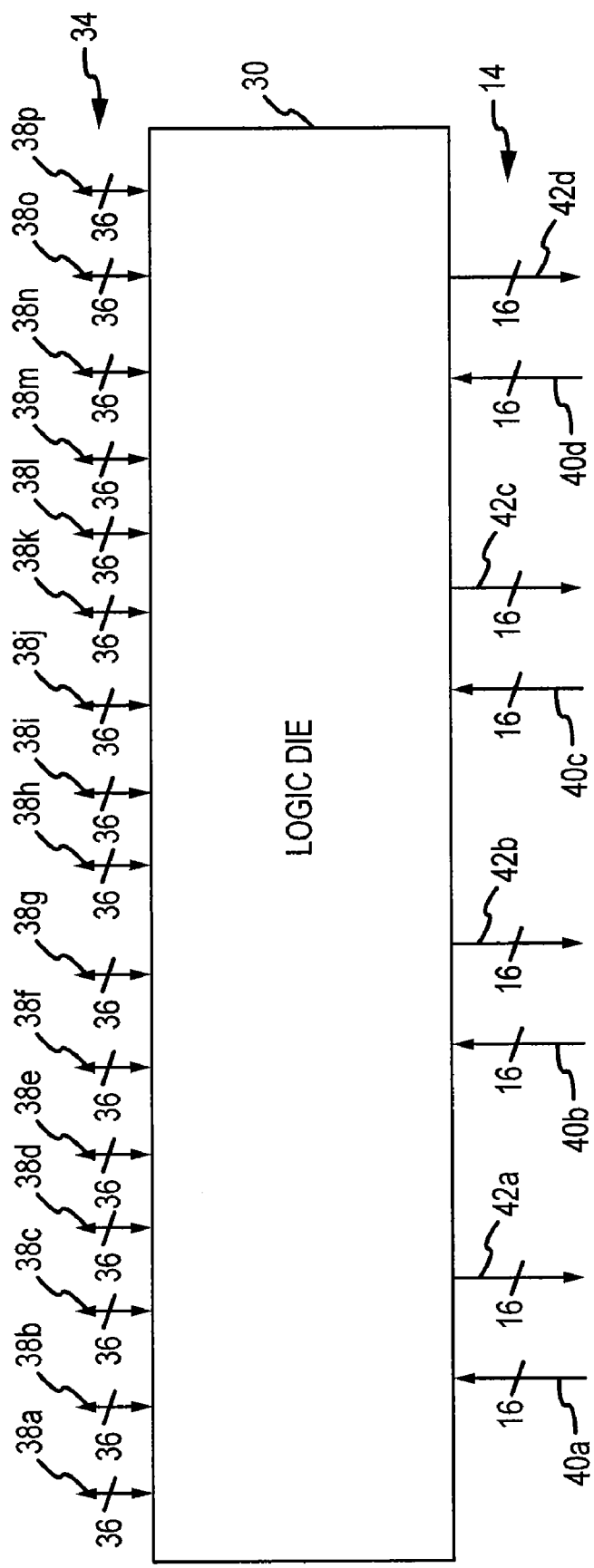
FIG. 2 is a block diagram of a memory device according to an embodiment of the invention.

As shown in FIG. 2, in one embodiment, the bus 34 is divided into 16 36-bit bi-directional sub-buses 38a-p, with each of the 16 36-bit sub-buses coupled to the 4 partitions in a respective vault, one on each of the separate die 20, 22, 24, and 26. Each of these sub-buses may couple 32 bits of a data and 4 ECC bits between the logic die 30 and the DRAM die 20, 22, 24, 26. However, the number of stacked DRAM die 20, 22, 24, 26, the number of partitions in each DRAM die, the number of banks in each partition, and the number of bits in each of the sub-buses 38a-p can vary as desired. The relatively narrow high-speed bus 14 connecting the processor 12 to the logic die is divided into 4 16-bit downstream lanes 40a-d and 4 separate 16-bit upstream lanes 42a-d. The 4 downstream lanes 40a-d may be connected to a single processor 12 as shown in FIG. 1, which may be a multi-core processor, to multiple processors (not shown), or to some other memory access device like a memory controller. The 4 downstream lanes 40a-d may operate either independently of each other so that packets are coupled through the lanes 40a-d at different times and to the same or different vaults.

As explained in greater detail below, one of the functions performed by the logic die 30 is to serialize the read data bits coupled from the DRAM die 20, 22, 24, 26 into serial streams of 16 serial data bits coupled in 16 parallel bits of each upstream lane 42*a-d* of the bus 14. Similarly, the logic die 30 may perform the functions of deserializing 16 serial data bits coupled through one of the 16-bit downstream lanes 40*a-d* of the bus 14 to obtain 256 parallel data bits. The logic die 30 then couples these 256 bits through one of the 32-bit sub-buses 38*a-p* in a serial stream of 8 bits. However, other embodiments may use different numbers of lanes 40, 42 having different widths or different numbers of sub-buses 38*a-p* having different widths, and they may couple data bits having different structures. As will be appreciated by one skilled in the art, the stacking of multiple DRAM die results in a memory device having a very large capacity. Further, the use of a very wide bus connecting the DRAM die allows data to be coupled to and from the DRAM die with a very high bandwidth.

Figure 3:
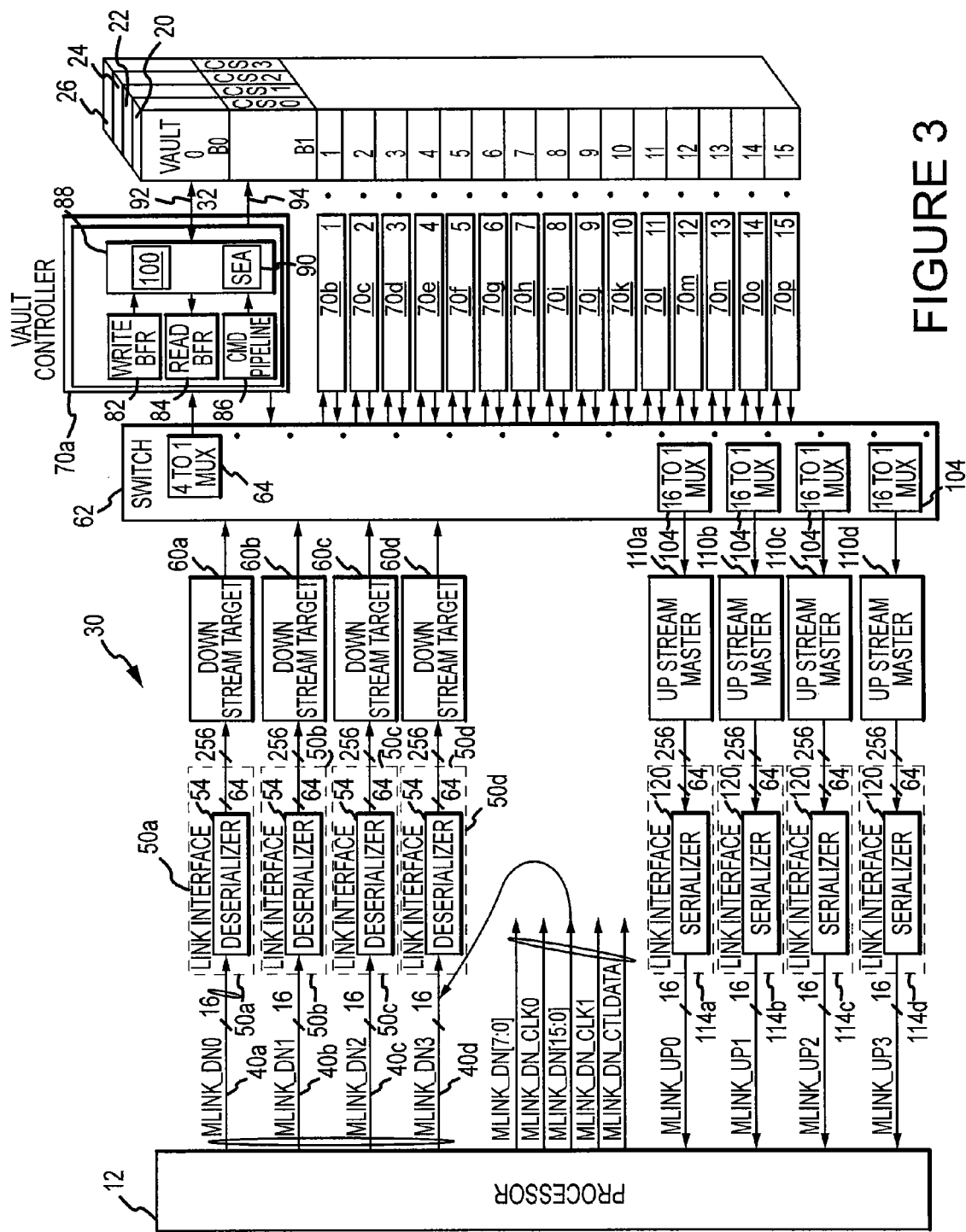
FIG. 3 is a more detailed block diagram of a memory device according to an embodiment of the invention.

A logic die 30 that can be tested according to an embodiment of the invention is shown in FIG. 3 connected to the processor 12 and the DRAM die 20, 22, 24, 26. As shown in FIG. 3, each of the 4 downstream lanes 40*a-d* is connected to a respective link interface 50*a-d*. Each link interface 50*a-d* includes a deserializer 54 that converts each serial stream of 16 data bits on each of the 16-bit lanes 40*a-d* to 256 parallel bits. Insofar as there are 4 link interfaces 50*a-d*, the link interfaces can together output 1024 output parallel bits.

Each of the link interfaces 50*a-d* applies its 256 parallel bits to a respective downstream target 60*a-d*, which decodes the command and address portions of the received packet and buffers write data in the event a memory request is for a write operation. The downstream targets 60*a-d* output their respective commands, addresses and possibly write data to a switch 62. The switch 62 contains 16 multiplexers 64 each of which direct the command, addresses and any write data from any of the downstream targets 60*a-d* to its respective vault of the DRAM die 20, 22, 24, 26. Thus, each of the downstream targets 60*a-d* can access any of the 16 vaults in the DRAM die 20, 22, 24, 26. The multiplexers 64 use the address in the received memory requests to determine if its respective vault is the target of a memory request. Each of the multiplexers 64 apply the memory request to a respective one of 16 vault controllers 70*a-p*.

Each vault controller 70*a-p* includes a write buffer 82, a read buffer 84 and a command pipeline 86. The command and addresses in memory requests received from the switch 62 are loaded into the command pipeline 86, and any write data in the memory requests are stored in the write buffer 82. The read buffer 84 is used to store read data from the respective vault, as will be explained in greater detail below. Both the write data from the write buffer 82 and the command from the command pipeline 86 are applied to a memory interface 88. The memory interface 88 may include a sequencer 90 and an ECC and defective memory cell repair system 100. The ECC and repair system 100 uses ECC techniques to check and correct the data read from the DRAM die 20, 22, 24, 26, and to assist the processor 12 or other memory access device to substitute redundant rows and columns for rows and columns, respectively, containing one or more defective memory cells. The sequencer 90 couples commands and addresses from the command pipeline 86 to the DRAM die 20, 22, 24, 26 through a command/address bus 92 and 32-bits of write data from the write buffer 82 and 4 bits of ECC from the ECC and repair system 100 to the DRAM die 20, 22, 24, 26 through a 36-bit data bus 94.

Although data are loaded into the write buffer 82 as 256 parallel bits, they are output from the buffer 82 in two sets, each set being 128 parallel bits. These 128 bits are then further serialized by the ECC and repair system 100 to 4 sets of 32-bit data, which are coupled thorough the data bus 94. In the embodiment shown in FIG. 3, write data are coupled to the write buffer 82 in synchronism with a 500 MHz clock so the data are stored in the write buffer at 16 gigabytes ("GB") per second. The write data are coupled from the write buffer 82 to the DRAM die 20, 22, 24, 26 using a 2 GHz clock so the data are output from the write buffer 82 at 8 GB/s. Therefore, as long as more than half of the memory requests are not write operations to the same vault, the write buffers 82 will be able to couple the write data to the DRAM die 20, 22, 24, 26 at least as fast as the data are coupled to the write buffer 82.

In the event a memory request is for a read operation, the command and address for the request are coupled to the DRAM die 20, 22, 24, 26 in the same manner as a write request, as explained above. In response to a read request, 32 bits of read data and 4 ECC bits may be output from the DRAM die 20, 22, 24, 26 through the 36-bit data bus 94. The ECC bits are passed to the ECC and repair system 100, which uses the ECC bits to check and correct the read data before passing the read data on to the read buffer 84. The ECC and repair system 100 also deserializes the 32 bits of read data into two sets of 128-bit read data. After 2 sets of 128-bit read data have been stored in the read buffer 84, the read buffer transmits 256 bits to the switch 62. The switch includes 4 output multiplexers 104 coupled to respective upstream masters 110*a-d*. Each multiplexer 104 can couple 256 bits of parallel data from any one of the vault controllers 70*a-p* to its respective upstream master 110*a-d*. The upstream masters 110*a* format the 256 bits of read data into packet data and couple the packet to respective upstream link interfaces 114*a-d*. Each of the link interfaces 114-*d* include a respective serializer 120 that converts the incoming 256 bits to a serial stream of 16 bits on each bit of a respective one of the 16-bit upstream links 42*a-d*.

The above description details how packets may be applied to a group of DRAM devices 20, 22, 24, 26 forming a stack containing logical vertical vaults of memory cells. As described above, the logic chip 30 may receive data on downstream lanes 40*a-d* and output data on upstream lanes 42*a-d*. Input data received in on a downstream lane in 16-bit increments is deserialized into a 256-bit packet and decoded by the relevant vault controller, such as vault controller 60*a*. Packets received from the vaults are serialized before application to upstream lanes 42*a-d*.

Figure 4:
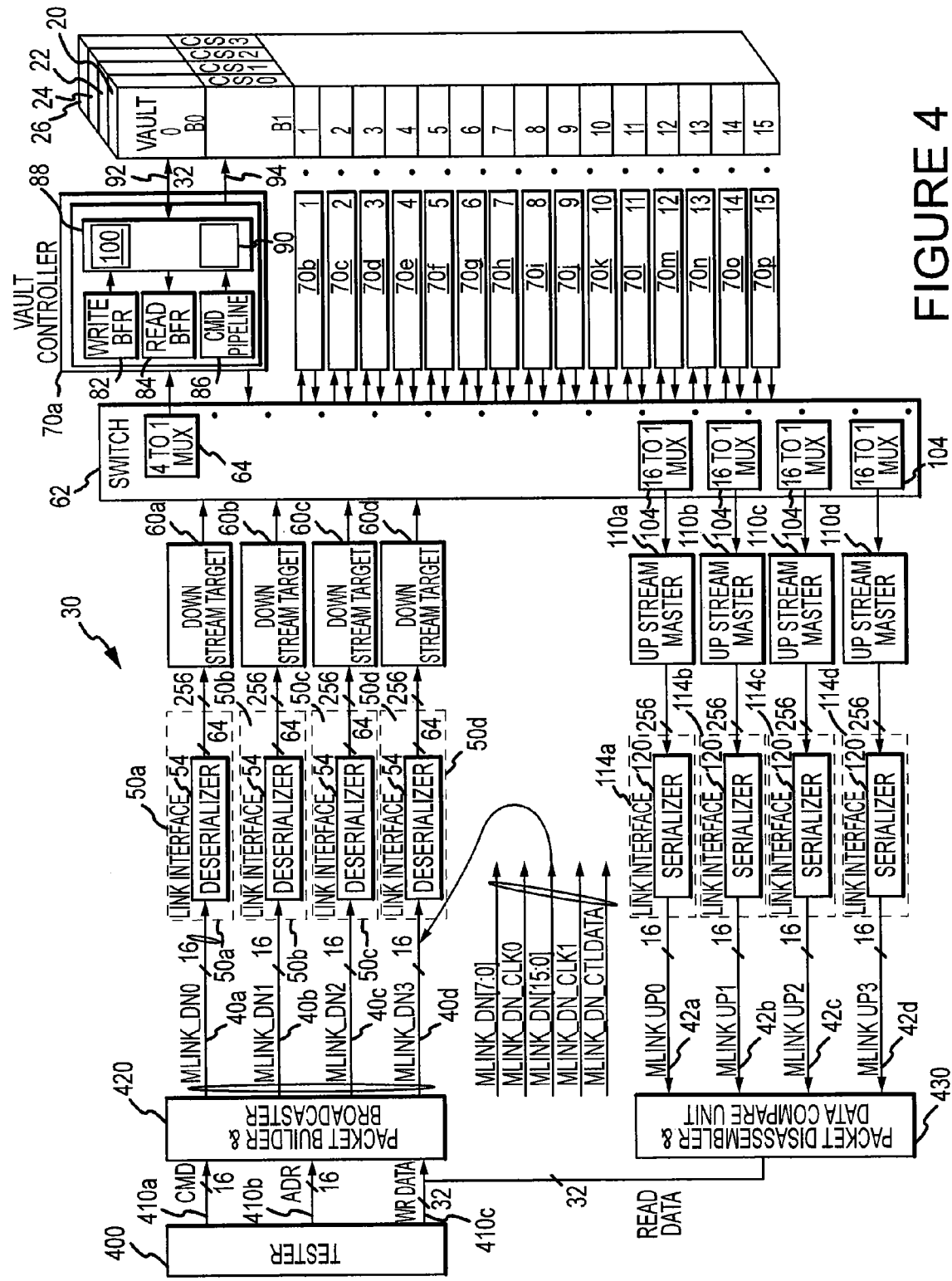
FIG. 4 is a block diagram of a memory device according to an embodiment of the invention coupled to a conventional tester.

A conventional tester 400, shown in FIG. 4, has a 16-bit command interface 410*a*, a 16-bit address interface 410*b* and a 32-bit bi-directional interface 410*c*. The interfaces 410*a-c* do not match up with the downstream lanes 40*a-d* and upstream lanes 42*a-d*. The signals on the command, address, and data interfaces 410*a-c* cannot be coupled directly to the downstream lanes 40*a-d* or upstream lanes 42*a-d*. For example, the lanes 40*a-d* and 42*a-d* are unidirectional and do not support bi-directional communication supported by the data interface 410*c*. Furthermore, sequential data received on each of the downstream lanes 40*a-d* is assembled into a packet that may contain command, address and data information.

To match signals provided by the tester 400 with information expected by the downstream lanes 40*a-d* of the logic chip 30, a packet builder and broadcaster 420 is provided. The logic chip 30 may be placed in a test mode. The test mode may be initiated, for example, by providing a control signal indicative of test operation. The packet builder and broadcaster 420 includes a first input port for receiving command signals from the tester over the command interface 410a, a second input port for receiving address signals from the tester 400 over the address interface 410b and a third input port for receiving data signals from the tester 400 over the data interface 410c.

In the test mode, according to one embodiment, the packet builder and broadcaster 420 receives command, address and optionally data signals from the tester 400 and reformats the received command, address and data signals into a format recognized by the logic chip 30. For example, the packet builder and broadcaster 420 may pass test command, address, and data signals sequentially to one of the downstream lanes 40a-d in the case of a write command. The test command, address and data signals are then passed through the link interface 50a to downstream target 60a to form a packet, as generally described above. Although the packet builder and broadcaster 420 is shown in FIG. 4 separate from the link interfaces 50a-d and downstream targets 60a-d, in some embodiments the packet builder and broadcaster 420 may include the link interfaces 50a-d, downstream targets 60a-d, or both.

It may be desirable to test multiple vaults using the same test command. Accordingly, the packet builder and broadcaster 420 may repeat the received test commands and apply them to multiple vaults. For example, the packet builder and broadcaster 420 may couple a test command to multiple lanes 40a-d either simultaneously or sequentially. The packet builder and broadcaster 420 may also direct a test command to be passed through multiple switches 62 to reach multiple vault controllers 70a-p. The packet builder and broadcaster may vary the received address signal as the test command is repeated such that the test command is directed to multiple vaults. Each respective vault controller 70a-p may receive and decode the broadcast write command as described above with respect to a routine command. In this manner, test signals generated by the conventional tester 400 on a command interface 410a, address interface 410b and data interface 410c may be assembled into packets expected by the vault controllers 70a-p and broadcast to multiple vaults.

As test read data is returned from the vaults in test mode, a packet disassembler and data compare unit 430 receives and compares the test read data returned from multiple vaults. Results of the comparison may be provided as a 32-bit data signal and coupled to the data interface 410c of the tester 400. Although the packet disassembler and data compare unit 430 is shown separate from the link interfaces 114a-d and upstream masters 110a-d, in some embodiments the packet disassembler and data compare unit 430 may include the link interfaces 114a-d, upstream masters 110a-d, or both. The data interface 410c is bidirectional, but each of the lanes 40a-d and 42a-d are unidirectional. Accordingly, both the packet builder and broadcaster 420 and the packet disassembler and data compare unit 430 are coupled to the data interface 410c.

Because the packet disassembler and data compare unit 430 conducts a comparison of test read data received from multiple vaults, the output test read data provided to the tester over the data interface 410c may indicate only that an error exists in one of the vaults tested. To isolate an error to a particular vault, the tester 400 may then provide test commands directed to a single vault. The packet builder and broadcaster 420 would then only pass the test command to a single vault, and an error could be isolated to a particular vault. In some embodiments, this further testing could include an analysis of whether the error was a hard or soft error.

As described above, the packet disassembler and data compare unit 430 may compare read data returned from several vaults and return results of the comparison to the tester 400. However, in some embodiments, the packet disassembler and data compare unit 430 may simply pass the read data returned from a vault back to the tester 400 for comparison at the tester with read data returned from other vaults, with the data expected to be returned, or both. The packet disassembler 430 may format the received read data in a manner expected by the tester 400, for example, placing the data in 32-bit chunks and coupling the read data to the bi-directional interface 410c. The packet disassembler and data compare unit 430 may sequentially couple read data received from a plurality of vaults to the tester 400.

Accordingly, the logic die 30 may include a packet builder and broadcaster 420 and a packet disassembler and data compare unit 430 that allow the stacked memory devices in multiple vaults to be tested using a conventional tester 400.

From the foregoing it will be appreciated that, although specific embodiments of the invention have been described herein for purposes of illustration, various modifications may be made without deviating from the spirit and scope of the invention. For example, although the embodiments of the invention are explained in the context of stacked DRAM die, it will be understood that the stacked die may be other types of memory device die, such as flash memory device die. Accordingly, the invention is not limited except as by the appended claims.

What is claimed is:

1. A memory device system, comprising:
   a plurality of stacked memory device die connected to each other through a plurality of conductors, each of the memory device die containing a plurality of memory cells having locations corresponding to respective memory addresses, the memory cells of the memory device die configured for access according to a plurality of vaults;
   a logic circuit die on which the memory device die are stacked, the logic circuit die being coupled to the memory device die through a plurality of conductors, the logic circuit die configured to write data to and read data from the memory device die, the logic circuit die including:
      a plurality of link interfaces configured to receive serial data and deserialize the data to obtain parallel data;
      a plurality of downstream targets, each coupled to a respective one of the plurality of link interfaces and configured to receive the parallel data from the respective link interface, decode command and address portions of the received parallel data;
      a switch coupled to the plurality of downstream targets, the switch configured to receive the decoded command and address portions of the received parallel data and couple the decoded command and address portions of the received parallel data to at least one of the plurality of vertical vaults corresponding to the received decoded address portion; and
      a packet builder and broadcaster coupled to the plurality of link interfaces, the packet builder and broadcaster including a first input port coupled to receive command signals from a tester on a first interface, and a second input port coupled to receive address signals from the tester on a second interface, the packet builder and broadcaster configured to reformat the command and address signals and to sequentially couple the reformatted command and address signals to at least one of the plurality of link interfaces.

2. The memory device system of claim 1 wherein the packet builder and broadcaster further comprises a third input port coupled to receive data signals from the tester on a third interface, the packet builder and broadcaster further configured to reformat the data signals and sequentially couple the reformatted data signals to the at least one of the plurality of link interfaces.

3. The memory device system of claim 1 wherein the packet builder and broadcaster is further configured to repeat the received command signals to a plurality of the vertical vaults.

4. The memory device system of claim 1 wherein the logic die further comprises:
a packet disassembler and data compare unit configured to receive data from a plurality of vaults, compare the received read data and couple results of the comparison to the tester over the third interface.

5. The memory device system of claim 4 wherein the read data from the plurality of vaults are coupled to the packet disassembler and data compare unit responsive to at least one read command and address coupled to the packet builder and broadcaster.

6. The memory device system of claim 1 further comprising a plurality of vault controllers, each coupled to a respective one of the plurality of vaults and configured to receive command and address signals from the switch and access their respective vault in accordance with the command and address signals.

7. The memory device system of claim 6 wherein the packet builder and broadcaster is configured to direct received command signals to a plurality of the vault controllers.

8. The memory device of claim 1 wherein the third interface is bi-directional.

9. The memory device system of claim 1 wherein each of the memory device die comprise a respective dynamic random access memory device die.

10. A system, comprising:
a tester including a first output port, a second output port and a third output port, the tester configured to output command signals at the first output port, address signals at the second output port and output or receive data signals at the third output port;
a first interface coupled to the first output port;
a second interface coupled to the second output port;
a third bi-directional interface coupled to the third output port; and
a memory device system comprising:
a plurality of stacked memory device die connected to each other through a plurality of conductors, each of the memory device die containing a plurality of memory cells having locations corresponding to respective memory addresses, the memory cells of the memory device die configured for access according to a plurality of vertical vaults;
a logic circuit die on which the memory device die are stacked, the logic circuit die being coupled to the memory device die through a plurality of conductors, the logic circuit die configured to write data to and read data from the memory device die, the logic circuit die comprising:
a plurality of link interfaces configured to receive serial data and deserialize the data to obtain parallel data;
a plurality of downstream targets, each coupled to a respective one of the plurality of link interfaces and configured to receive the parallel data from the respective link interface, decode command and address portions of the received parallel data;
a switch coupled to the plurality of downstream targets, the switch configured to receive the decoded command and address portions of the received parallel data and couple the decoded command and address portions of the received parallel data to at least one of the plurality of vertical vaults corresponding to the received decoded address portion; and
a packet builder and broadcaster coupled to the plurality of link interfaces, the packet builder and broadcaster including a first input port coupled to receive command signals from a tester on a first interface, and a second input port coupled to receive address signals from the tester on a second interface, the packet builder and broadcaster configured to reformat the command and address signals and to sequentially couple the reformatted command and address signals to at least one of the plurality of link interfaces.

11. The memory device system of claim 10 wherein the packet builder and broadcaster further comprises a third input port coupled to receive data signals from the tester on the third interface, the packet builder and broadcaster further configured to reformat the data signals and sequentially couple the reformatted data signals to the at least one of the plurality of link interfaces.

12. The memory device system of claim 10 wherein the packet builder and broadcaster is further configured to repeat the received command signals to a plurality of the vertical vaults.

13. The memory device system of claim 10 wherein the logic die further comprises:
a packet disassembler and data compare unit configured to receive data from a plurality of vaults, compare the received read data and couple results of the comparison to the tester over the third interface.

14. The memory device system of claim 13 wherein the read data from the plurality of vaults are coupled to the packet disassembler and data compare unit responsive to at least one read command and address coupled to the packet builder and broadcaster.

15. The memory device system of claim 10 further comprising a plurality of vault controllers, each coupled to a respective one of the plurality of vaults and configured to receive command and address signals from the switch and access their respective vault in accordance with the command and address signals.

16. The memory device system of claim 15 wherein the packet builder and broadcaster is configured to direct received command signals to a plurality of the vault controllers.

17. The memory device of claim 10 wherein the third interface is bi-directional.

18. The memory device system of claim 10 wherein each of the memory device die comprise a respective dynamic random access memory device die.

* * * * *